United States Patent
Knowles et al.

(10) Patent No.: US 7,459,834 B2
(45) Date of Patent: Dec. 2, 2008

(54) SOLID STATE GIMBAL SYSTEM

(75) Inventors: Gareth J. Knowles, Williamsport, PA (US); Maureen Mulvihill, Bellefonte, PA (US); Kenji Uchino, State College, PA (US); Brian Shea, Albuquerque, NM (US)

(73) Assignee: QorTek, Inc., Williamsport, PA (US)

( * ) Notice: Subject to any disclaimer, the term of this patent is extended or adjusted under 35 U.S.C. 154(b) by 205 days.

(21) Appl. No.: 11/472,673

(22) Filed: Jun. 22, 2006

(65) Prior Publication Data

US 2008/0106170 A1      May 8, 2008

Related U.S. Application Data

(60) Provisional application No. 60/692,938, filed on Jun. 22, 2005.

(51) Int. Cl.
*H01L 41/08*      (2006.01)
(52) U.S. Cl. ................... 310/328; 310/333; 310/323.02
(58) Field of Classification Search ................. 310/338, 310/323.02, 328
See application file for complete search history.

(56) References Cited

U.S. PATENT DOCUMENTS

| | | | |
|---|---|---|---|
| 4,727,278 A | 2/1988 | Staufenberg, Jr. et al. | |
| 5,696,421 A | 12/1997 | Zumeris et al. | |
| 5,872,417 A | 2/1999 | Sugaya | |
| 6,384,515 B1 * | 5/2002 | Ganor et al. | 310/328 |
| 6,404,104 B1 * | 6/2002 | Maeno et al. | 310/323.02 |
| 6,437,485 B1 | 8/2002 | Johansson | |
| 6,734,914 B1 | 5/2004 | Nishimura et al. | |
| 6,940,210 B2 | 9/2005 | Karrai et al. | |

* cited by examiner

*Primary Examiner*—Darren Schuberg
*Assistant Examiner*—Bryan P Gordon
(74) *Attorney, Agent, or Firm*—Michael Crilly, Esq.

(57) ABSTRACT

A non-mechanical gimbal system is presented. The gimbal system includes a gimbal housing, including hemispherical and annular caps, rotatable sphere, and at least two curvilinear actuators. The hemispherical cap is attached to the annular cap in a removable fashion so as to surround the rotatable sphere. The curvilinear actuators are disposed between the rotatable sphere and gimbal housing. Curvilinear actuators rotate the rotatable sphere, via shear induced motion, with respect to the interior surface of the gimbal housing. The present invention has immediate applicability within security devices, games, toys, weapons (including guidance systems and aiming), and communication systems.

22 Claims, 11 Drawing Sheets ies and bearings. Exemplary systems include a gyroscope and mechanically complicated inner and outer gimbal elements, so as to achieve tilt within a range limited by the size of components within and packaging of the system. As such, altitude-azimuth systems are inherently complex, costly, and heavy. Furthermore, components are susceptible to stiction, fretting, and friction, which limit and frustrate the translation of any device mounted to the gimbal.

SOLID STATE GIMBAL SYSTEM

CROSS REFERENCE TO RELATED APPLICATIONS

This application is based upon and claims priority under 35 U.S.C. § 119(e) from U.S. Provisional Application No. 60/692,938 filed Jun. 22, 2005, entitled "Solid State Gimbal System", the contents of which are hereby incorporated in its entirety by reference thereto.

FEDERALLY SPONSORED RESEARCH AND DEVELOPMENT

The invention disclosed herein was supported, at least in part, by a grant from the Defense Advance Research Projects Agency (DARPA) under DARPA Order No. S039-38 issued by the U.S. Army Aviation and Missile Command under Contract No. W31P4Q-05-C-0180. The Government has certain limited rights to at least one form of the invention.

BACKGROUND OF THE INVENTION

1. Field of the Invention

The present invention generally relates to a gimbal system. Specifically, the invention is a lightweight, robust gimbal actively controllable via curvilinear piezo-actuators operating in the shear mode which directly contact and rotate a spherical-shaped element within a like-shaped housing.

2. Description of the Related Art

Games, toys, weapons and communication systems typically couple an acoustic-based device, a light-based device, an imaging device or the like to hardware for the purpose of transmitting, recording, detecting, classifying, and/or tracking. Presently known devices are aimed by a variety of steering methods.

Altitude-azimuth steering systems are typically composed of gyroscopes, motors, rings, and bearings. Exemplary systems include a gyroscope and mechanically complicated inner and outer gimbal elements, so as to achieve tilt within a range limited by the size of components within and packaging of the system. As such, altitude-azimuth systems are inherently complex, costly, and heavy. Furthermore, components are susceptible to stiction, fretting, and friction, which limit and frustrate the translation of any device mounted to the gimbal.

Waveguide steering includes various approaches. For example, an array of actuators might translate a microlens array along orthogonal lateral directions. Large two-dimensional lenslet arrays are possible wherein pixels are independently controlled. In another example, liquid crystal optical phase arrays (LC-OPAs) steer a beam via a phase change electrically introduced along the array. Steering results when an incident beam sees a varying refractive index as it propagates along the array. While the described approaches accurately steer a beam to within submicron accuracy, both are mechanically and electrically complex, difficult and costly to manufacture, fragile, and unreliable in and/or unsuitable to many applications.

Several steering systems based upon piezoelectric actuators are also noteworthy.

Nishimura et al., in U.S. Pat. No. 6,734,914, describes and claims an image recording unit permitting 360 degrees of rotation. The device includes four sets of piezoelectric elements, a rotary unit fixing frame, and a spherical rotary unit. Piezoelectric elements operate in the longitudinal mode, whereby each linear rectangular actuator is electrically poled and driven through its thickness, referred to as the $d_{33}$ mode, or is electrically poled through its thickness and driven along its length, referred to as the $d_{31}$ mode. The spherical rotary unit contacts and presses against the fixing frame. Piezoelectric elements are arranged and electrically activated in a pair-wise fashion so that a traveling wave is formed in the fixing frame around either the Y-axis and/or X-axis. Thereafter, the fixing frame exhibits motion which is communicated to the spherical rotary unit so as to frictionally drive the rotary unit. As such, the piezoelectric elements do not directly drive the spherical rotary unit.

Johansson, in U.S. Pat. No. 6,437,485, describes and claims a double bimorph electromechanical element capable of rotating an element via bending motion along the piezoelectric device.

Sugaya, in U.S. Pat. No. 5,872,417, describes and claims a device capable of rotating a sphere via a plurality of piezoelectric elements that first vibrate an elastic member which is thereafter communicated into the sphere as rotational motion.

Staufenberg, Jr. et al. in U.S. Pat. No. 4,727,278 describes and claims a device capable of rotating a sphere via the electromechanical translation of linear piezoelectric elements which expand and contract in response to electrical signals.

The related arts do not provide a gimbal device capable of rapidly rotating a sphere via the direct contact by curvilinear actuators comprised of a piezoelectric material operating in the shear mode, also referred to as $d_{12}$, $d_{14}$, $d_{15}$, or $d_{16}$ mode.

Therefore, what is required is a lightweight, low-volume, and mechanically simple gimbal device which provides for the direct rotational drive of a spherical element by curvilinear piezoelectric actuators operating in the shear mode.

SUMMARY OF INVENTION

An object of the present invention is to provide a lightweight, low-volume, and mechanically simple gimbal device which provides for the direct rotational drive of a spherical element by curvilinear piezoelectric actuators operating in the shear mode.

In the present invention, a rotatable sphere is accurately rotated and positioned within a gimbal housing by four non-bimorph piezoelectric actuators. Piezoelectric actuators operate in a shear mode (such as $d_{15}$) rather than a longitudinal mode ($d_{31}$ or $d_{33}$). Shear mode motion includes both linear and bending components within the same piezoelectric material. The shear mode is achieved by a combination of two voltage directions whereby a piezo-ceramic is poled from end to end along the longest length of the actuator and electrically powered via electrodes disposed about the thickness of the same actuator. Shear mode actuators ensure greater electromechanical coupling and as such are capable of directly driving the rotatable sphere.

The present invention is a modular solid state gimbal system comprised of a gimbal housing, including hemispherical and annular caps, rotatable sphere, and at least two curvilinear actuators. The hemispherical cap is attached to the annular cap in a removable fashion so as to surround the rotatable sphere. The rotatable sphere has a radius of curvature less than that of the gimbal housing. Curvilinear actuators are disposed between the rotatable sphere and gimbal housing. Curvilinear actuators rotate the rotatable sphere, via shear induced motion, with respect to the interior surface of the gimbal housing. Hemispherical and annular caps are dimensionally sized to compress the curvilinear actuators against the rotatable sphere. An acoustic, light, or optical device may be attached to the rotatable sphere so as to allow precision aiming of the device at a high angular rate over a wide acceptance angle.

Several advantages are noteworthy. The present invention is scalable for use within many applications, including MEMS. The present invention requires substantially less power than mechanically actuated gimbals. The present invention has substantially less moving parts than mechanically actuated gimbals, thereby providing higher operational reliability. The present invention is lighter and smaller than mechanically actuated gimbals. The present invention enables a large field of view over a wide acceptance angle with higher angular rotation rates and precision than mechanically actuated gimbals.

REFERENCE NUMERALS

| | |
|---|---|
| 1 | Gimbal system |
| 2 | Hemispherical cap |
| 3 | Rotatable sphere |
| 4 | Socket |
| 5 | Spherical profile |
| 6 | Device |
| 7a-7d | Curvilinear actuator |
| 8 | Field of view |
| 9 | Electrode |
| 10 | Piezoelectric layer |
| 11 | Electrode |
| 12 | Storage medium |
| 13 | Programmable logic device |
| 14 | USB module |
| 15 | Sensor |
| 16 | Support cavity |
| 17 | Central axis |
| 18 | Protrusion |
| 19 | Curvilinear actuator |
| 20 | Annular cap |
| 21 | Gimbal housing |
| 22 | Opening |
| 23 | Opening |
| 24 | Channel |
| 25 | Optical tracker |
| 26 | Joystick |
| 27 | Controller |
| 28 | Direct digital synthesizer |
| 29 | Direct digital synthesizer |
| 30 | Target |
| 31a-31b | Receiver |
| 32 | Phase detector |
| 33 | Position controller |
| 34 | Acoustic tracking system |
| 35 | Variable gain amplifier |
| 36 | Amplifier |
| 37 | Amplifier |
| 38 | Optical sensor |
| 39a-39d | Curvilinear actuator |
| 40a-40c | Target |
| 41 | Image Processor |
| 42 | Position controller |
| 43 | Optical tracking system |
| 44 | Seam |

BRIEF DESCRIPTION OF THE DRAWINGS

The invention will now be described in more detail, by way of example only, with reference to the accompanying drawings, in which.

DETAILED DESCRIPTION OF THE INVENTION

Figure 1:
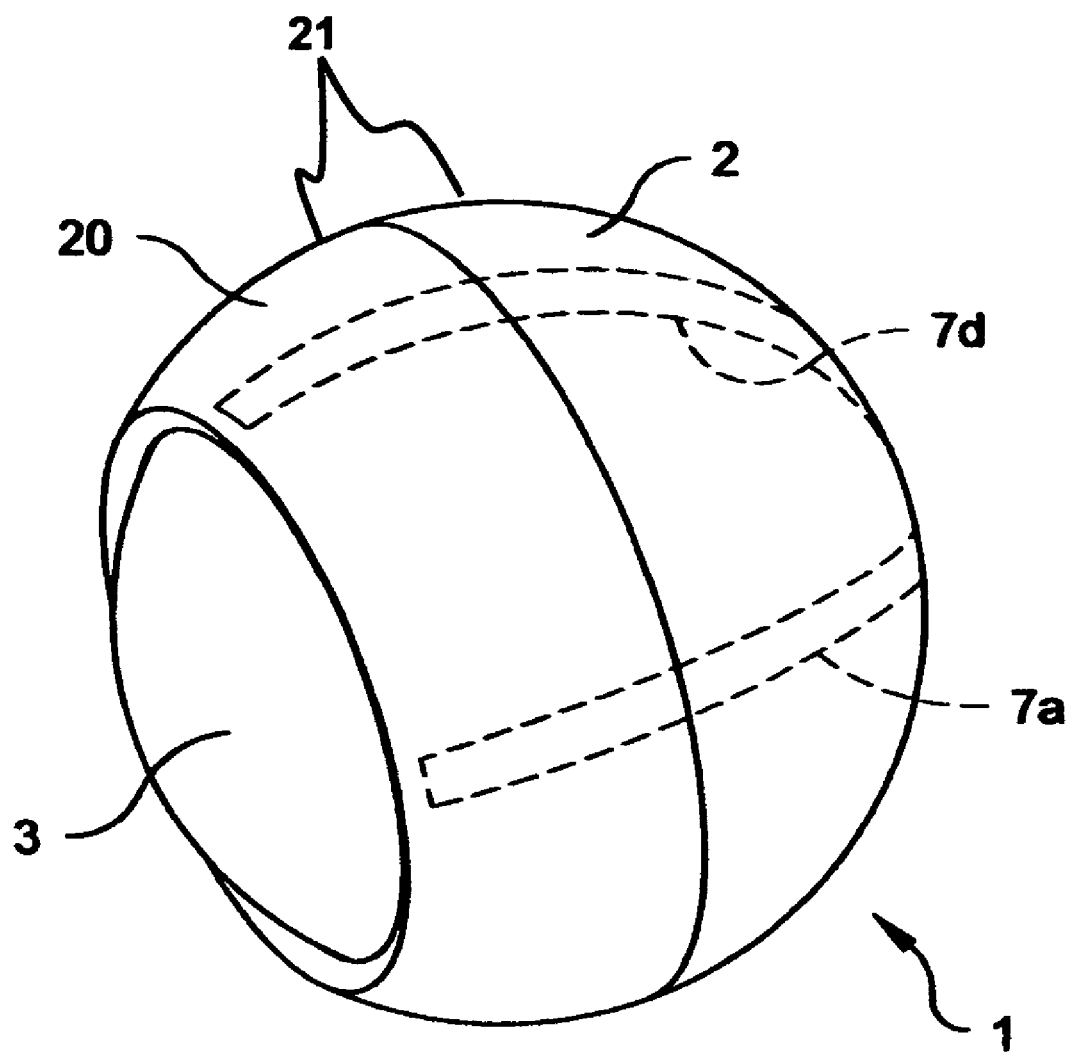
FIG. 1 is a perspective view showing one embodiment of the solid state gimbal system for the present invention.

Referring now to FIG. 1, the gimbal system 1 is shown in a perspective view including a rotatable sphere 3 disposed within a gimbal housing 21, comprising a hemispherical cap 2 and an annular cap 20, with at least two curvilinear actuators 7a, 7d (actuators 7b and 7c not shown) disposed between the rotatable sphere 3 and gimbal housing 21. The rotatable sphere 3 and gimbal housing 21 are dimensioned so as to form a press or compression fit with the curvilinear actuators 7a-7d sufficiently to fix the rotatable sphere 3 in a specific orientation when the curvilinear actuators 7a-7d are electrically inactive. It is also required for the press or compression fit to allow rotation of the rotatable sphere 3 when the curvilinear actuators 7a-7d are activated by an electric field.

Figure 2:
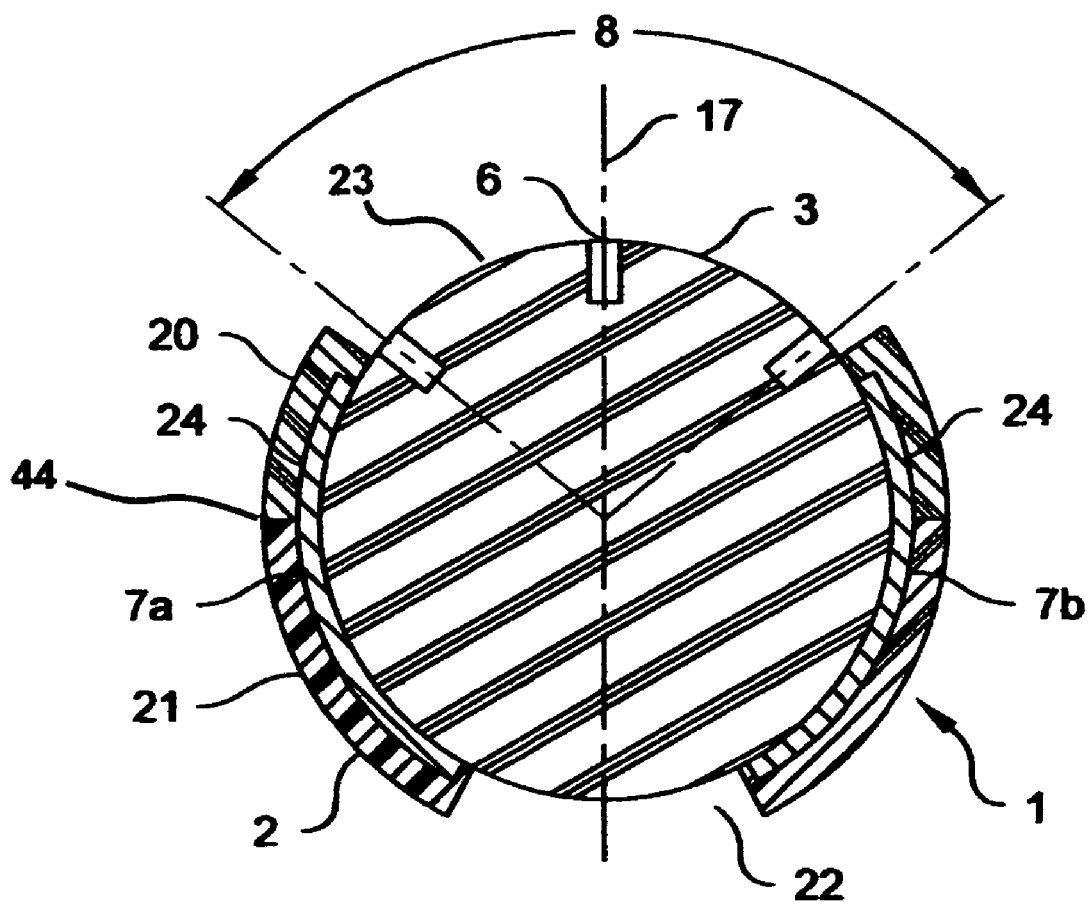
FIG. 2 is a cross sectional view of the present invention showing the solid state gimbal system including a gimbal housing comprised of a lower hemispherical cap and an upper annular cap mutually attached and surrounding a rotatable sphere with four curvilinear actuators disposed between and compressed by the sphere and housing.
Figure 3:
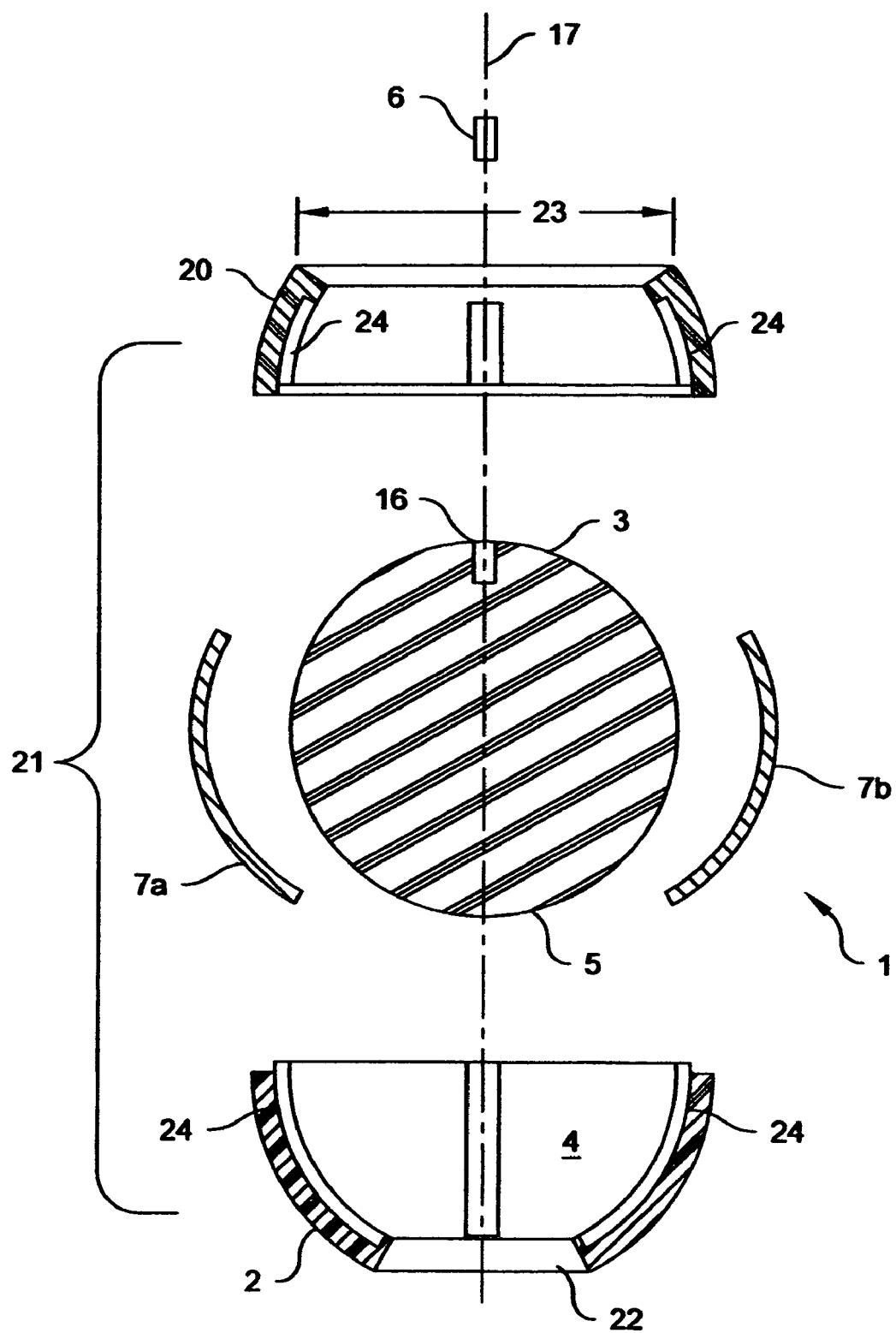
FIG. 3 is an exploded section view of the gimbal system embodiment described in FIGS. 1 and 2.

Referring now to FIGS. 2 and 3, the gimbal system 1 is shown in more detail comprised of a hemispherical cap 2, an annular cap 20, curvilinear actuators 7a-7d, and a rotatable sphere 3. Hemispherical cap 2, rotatable sphere 3, and annular cap 20 are preferred to be composed of dimensionally stable and non-conductive materials, non-limiting examples including polymers and composites. Furthermore, the rotatable sphere 3 may include a dense metal insert to increase its total mass without compromising the non-conductive nature of the element. The gimbal housing 21 may be fabricated via conventional manufacturing methods, including machining, stereo lithography, injection molding, and extrusion. Curvilinear actuators 7a, 7b (actuators 7c and 7d not shown) are generally composed of a piezoelectric material, preferably a piezoceramic, one example being PZT, disposed between a pair of electrically conductive elements, preferably composed of a metal. Conventional methods are also applicable to the fabrication, poling, and electroding of curvilinear actuators 7a-7d.

The gimbal housing 21 is composed of a two-piece construction, namely, hemispherical cap 2 and annular cap 20, so as to facilitate assembly of the rotatable sphere 3 and curvilinear actuators 7a-7d into the interior cavity of the gimbal system 1. The annular cap 20 may be mechanically or adhesively fastened to the hemispherical cap 2 along a mutually aligned and contacting seam 44 or flange arrangement. While it is preferred for the seam 44 between the hemispherical cap 2 and annular cap 20 to be located along the center of the gimbal housing 21, the location of the seam 44 must provide an opening of sufficient diameter so as to allow insertion of the rotatable sphere 3 into the gimbal housing 21. The interior contour of the gimbal housing 21 is preferred to be spherically shaped and dimensionally larger than the diameter of the rotatable sphere 3.

Curvilinear actuators 7a-7d are generally described as elongated elements disposed in a radial fashion about the central axis 17 and contacting both hemispherical cap 2 and annular cap 20 along a first surface and the rotatable sphere 3 along a second surface. Each curvilinear actuator 7a-7d contacts the interior of the hemispherical cap 2 beginning at the seam 44 and ending adjacent to opening 22 which resides at the bottom of the hemispherical cap 2. Likewise, each curvilinear actuator 7a-7d contacts the interior of the annular cap 20 beginning at the seam 44 and ending adjacent to the opening 23 at the top of the annular cap 20. While an infinite number of designs are possible for the present invention, it was preferred for each curvilinear actuator 7a-7d to sufficiently long so as to provide an arc with a total angle from 80 to 90 degrees. In some embodiments, it may be preferred to include a layer of soft material, examples including felt or rubber, between the rotatable sphere 3 and hemispherical cap 2 and annular cap 20 to reduce the damping of the shear mode dynamics within the curvilinear actuators 7a-7d by the gimbal housing 21. In other embodiments, it may be preferred to adhesively bond the curvilinear actuators 7a-7d to the hemispherical cap 2 and/or annular cap 20.

In some embodiments of the invention, it was preferred for the curvilinear actuators 7a-7d to exhibit both bending mode and shear mode vibrations. The coupling of these two modes was found to be dependent on the length-to-thickness ratio of the curvilinear actuators 7a-7d. While mode coupling is possible over a variety of length-to-thickness ratios, coupled modes were achieved in a traveling wave along the curvilinear actuators 7a-7d at a ratio equal to 12.

The opening 23 within the annular cap 20 and opening 22 within the hemispherical cap 2 are preferred to be circular shaped and symmetrically disposed about the central axis 17. The diameter of the opening 23 determines the field of view 8 for a device 6 attached to or within the support cavity 16 which is provided within the rotatable sphere 3 adjacent to the opening 23. It was preferred for the opening 23 to have a total angle of 110 degrees, although other values are possible.

The gimbal housing 21 is preferred to include channels 24 which are dimensioned so as to sufficiently accommodate the length and width of the curvilinear actuators 7a-7d, so as to support the curvilinear actuators 7a-7d in a non-binding fashion. The depth of each channel 24 should be less than the thickness of the curvilinear actuators 7a-7d so that the curvilinear actuators 7a-7d extend into the interior cavity of the gimbal housing 21.

The spherical ball 3 is supported within the structure formed by the hemispherical cap 2 and annular cap 20 so as to compress the curvilinear actuators 7a-7d. Compression of the curvilinear actuators 7a-7d couples shear induced motion within the curvilinear actuators 7a-7d to rotational motion of the spherical ball 3 about the field of view 8. Compression is achieved when $$r_{is}+d_c-t_{ca}<r_{rs}$$

where $r_{is}$ is the radius of the interior surface of the gimbal housing 21, $d_c$ is the depth of the channel 24, $t_{ca}$ is the thickness of the curvilinear actuator 7a-7b, and $r_{rs}$ is the radius of the rotatable sphere 3.

Referring again to FIGS. 2 and 3, the hemispherical cap 2 is shown with a socket 4 therein; although, other generally symmetrical shapes about a central axis 17 are likewise possible. Curvilinear actuators 7a-7d are attached to the interior surface of the hemispherical cap 2 within the socket 4, preferably in a symmetrically disposed fashion. Each curvilinear actuator 7a-7d extends beyond the seam 44 so as to ensure continued contact between the rotatable sphere 3 and both hemispherical cap 2 and annular cap 20. Curvilinear actuators 7a, 7b are required to be shear-type devices. The annular cap 20 is identical or nearly identical to the hemispherical cap 2 in size and cross section. The opening 23 is provided to ensure an unobstructed field of view 8 for the device 6 attached to or within the support cavity 16. The support cavity 16 should be sufficiently shaped so as to allow fixed and precise attachment of the device 6 to the rotatable sphere 3 via methods understood in the art.

The spherical ball 3 is preferred to have a spherical profile 5. The spherical profile 5 should match or nearly match the contour of the curvilinear actuators 7a-7d so as to ensure complete, yet slidable contact between the curvilinear actuators 7a-7d and rotatable sphere 3.

Figure 4:
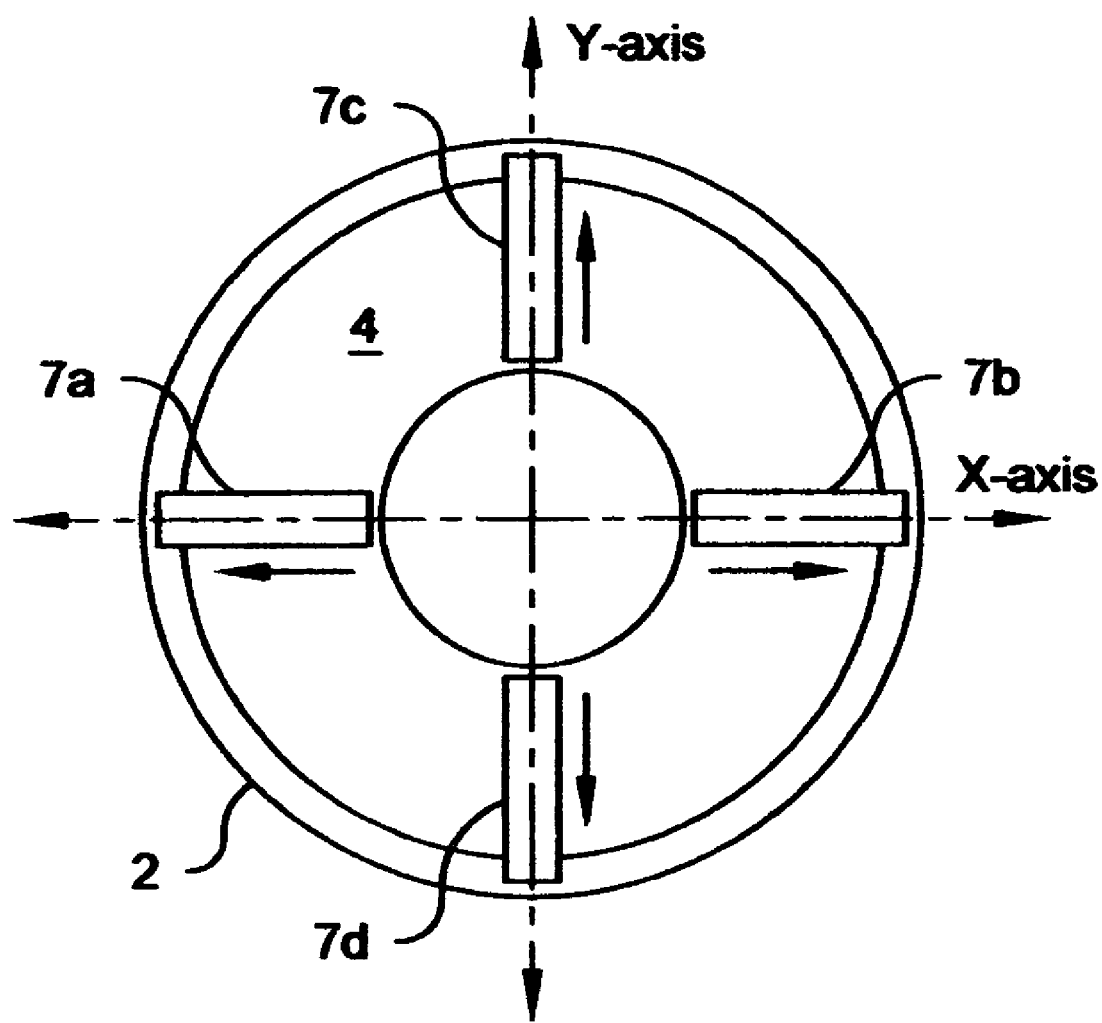
FIG. 4 is a top view of the gimbal system shown in FIGS. 1 and 2 without rotatable sphere showing the paired and opposed arrangement of curvilinear actuators along both the X-axis and the Y-axis.

Referring now to FIG. 4, the hemispherical cap 2 is shown with two pair-wise arrangements of curvilinear actuators 7a-7b and 7c-7d within the socket 4, although other arrangements are possible. Two curvilinear actuators 7a, 7b are disposed along the X-axis in a symmetric fashion. Likewise, two curvilinear actuators 7c and 7d are disposed along the Y-axis in a symmetrical fashion. It is preferred for the curvilinear actuators 7a-7d to be unidirectional and functionally paired, as represented by the arrows in FIG. 4, so as to enable rotation about the Z-axis. For example, curvilinear actuators 7a and 7d are shown functionally aligned to induce clockwise rotation of the rotatable sphere 3; whereas, curvilinear actuators 7b and 7c are arranged to induce counter-clockwise rotation of the same. Furthermore, compound rotations are possible where X-axis and Y-axis actuators are electrically activated simultaneously or in sequence. Other functional arrangements and applications of the curvilinear actuators 7a-7d are possible, including but not limited to a single bi-directional and unidirectional actuator disposed along the X-axis and Y-axis.

Figure 5:
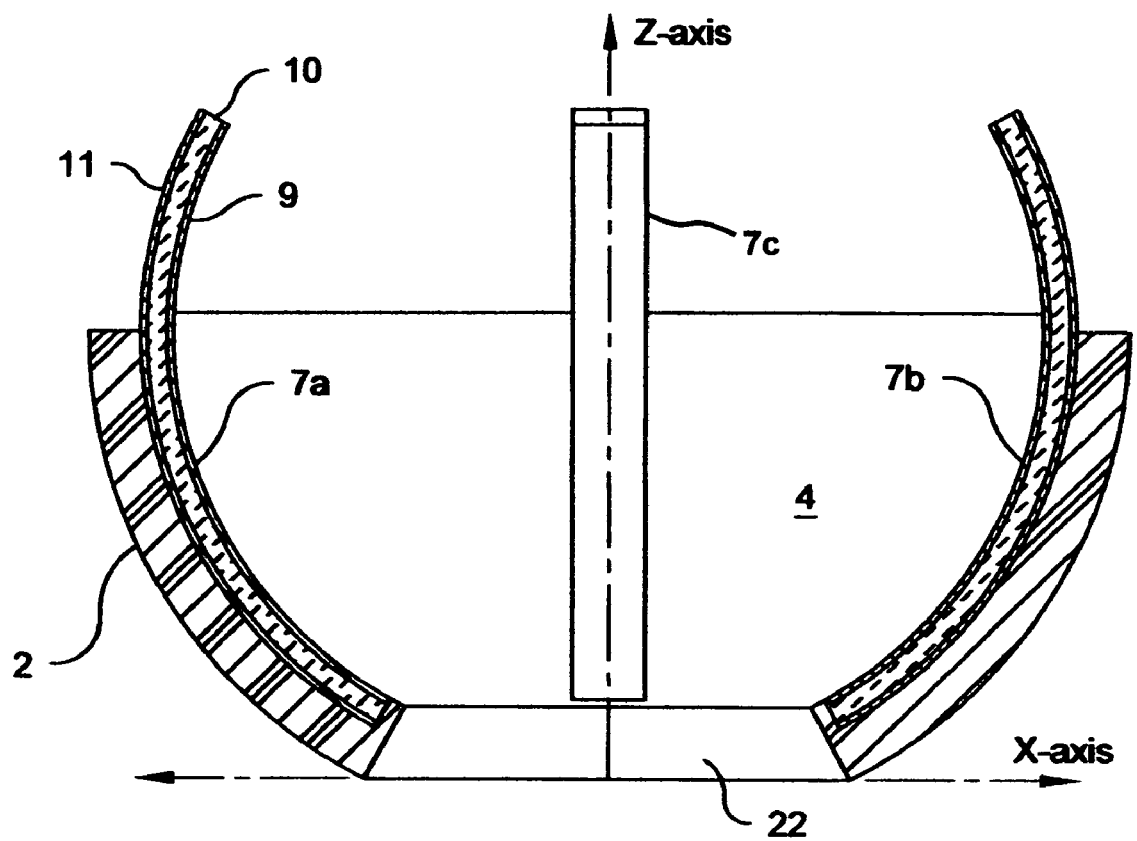
FIG. 5 is an enlarged section view of the hemispherical cap showing exemplary curvilinear actuators composed of a piezoelectric layer disposed between a pair of electrodes.

Referring now to FIG. 5, exemplary curvilinear actuators 7a, 7b are shown comprised of a pair of electrodes 9, 11 disposed about and attached to a piezoelectric layer 10. The piezoelectric layer 10 may be composed of one or more plates of PZT material or the like.

Curvilinear actuators 7a-7d function as an ultrasonic motor when energized so as to couple vibrational energy directly into the rotatable sphere 3, thereby causing it to rotate in a preferred direction. The length-to-thickness ratio of the piezoelectric layer 10 is tailored to optimize electromechanical coupling, so as to maximize a shear mode (such as $d_{15}$) rather than the longitudinal modes ($d_{31}$ or $d_{33}$). The resultant shear vibration mode produces a corresponding bending mode thereby causing a traveling wave along the piezoelectric plate.

Curvilinear actuators 7a-7d are arc-shaped segments with a total length to achieve the desired angular coverage. In one embodiment of the invention, curvilinear actuators 7a-7d were fabricated having an inner radius of 29.21 mm, an outer radius of 30.23 mm, a thickness of 1.10 mm, and a total angle of 80 degrees.

Curvilinear actuators 7a-7d were fabricated from unfired green tape composed of hard PZT and an organic binder. The tape was cut into strips, layered, and shaped to form a green body. Dimensions of the green body were oversized based on the densification properties of the green material to account for shrinkage during sintering, which could be as large as 16%. The green body was placed onto a mold composed of zirconia having a profile which replicated the desired arc shape of the actuator. The ends of the green body were constrained so as to avoid curling during the sintering process. After sintering, the ceramic body was machined and polished to ensure the required dimensional properties.

Next, the curved ceramic actuator bodies were poled to enhance their piezoelectric properties. The shear mode material response desired in the present invention required the poling orientation to be along the arc length of each ceramic body. As such, a conductive paint comprised of silver palladium (AgPd) was applied to both ends of each ceramic body and then cured at 850° C. for 15 minutes. The poling voltage was generally material dependent. For example, hard PZT electro-ceramics are normally poled at 1 kV for each millimeter of length. Thus, a 45 kV voltage was applied to a ceramic body having an arc length of 45 mm. It was preferred to secure the ceramic actuator body to a non-conductive planar fixture during the poling process. The planar fixture included a pair of metal pins so as to contact the electrodes at the ends of the ceramic actuator body and to support the ceramic actuator body. A non-conductive pin was also disposed along the jig and centrally located so as to contact and support the ceramic actuator body at its midpoint. A thin piece of polytetrafluoroethylene was employed to wedge the ceramic actuator body tightly against the non-conductive pin. Thereafter, the fixture with ceramic actuator body was submersed in a bath of silicon oil at a temperature of 150° C. and a voltage applied thereto. The temperature of the bath enhanced poling; whereas, the bath provided a dielectric medium to avoid breakdown.

After poling, the fixture and ceramic actuator body were removed and the piezoelectric coefficient ($d_{33}$) was measured to determine the degree of poling. A 10 mm arc length was cut from the ceramic actuator body so that its length was short enough compared to its radius to approximate a linear segment. A $d_{33}$ value of 284 pm/V was measured which is slightly higher than 90% of the theoretical $d_{33}$ value (315 pm/V) for the hard PZT composition. Thereafter, the end electrodes were removed.

Next, electrodes were applied to the top and bottom surfaces of the ceramic actuator body perpendicular to the poling direction to effect shear mode behavior within the actuator. The electroding method was performed at low temperature to avoid depoling of the ceramic actuator body.

Ceramic actuator bodies were electroded with nickel plating via a four step process. First, the poled ceramic actuators bodies were etched in a flouroboric bath to roughen the exterior surface of the bodies and to enhance adhesion between electrodes and the ceramic. Next, the ceramic actuator bodies were immersed within a room temperature bath of SnCl dissolved in HCl to deposit a Sn layer onto the ceramic. Thereafter, the ceramic actuator bodies were immersed within a bath containing PdCl, thus depositing a Pd layer onto the Sn layer. Finally, the ceramic actuator bodies were immersed within a bath of Ni at a temperature of 70° C., thus depositing a Ni layer onto the Pd layer. Excess Ni was removed from non-electrode surfaces via a dry polished step. The resultant curvilinear actuators 7a-7d demonstrated a resonant frequency from 470 kHz to 475 kHz.

Figure 6:
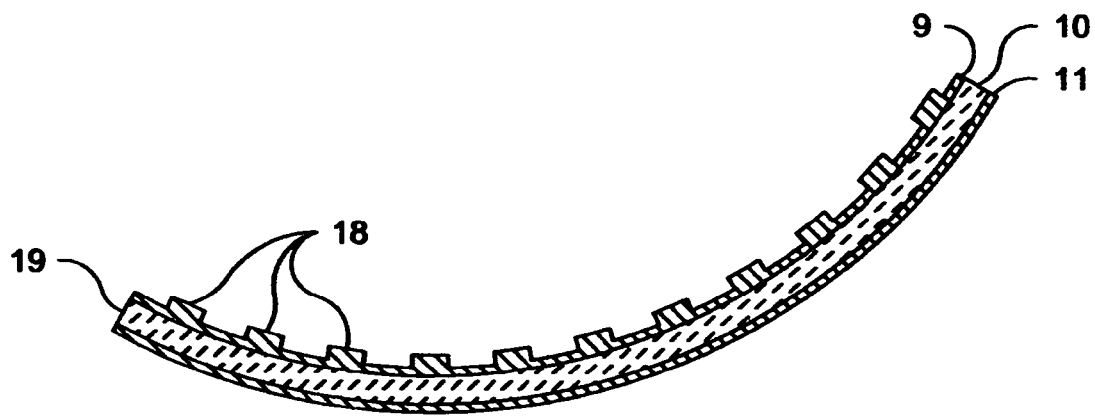
FIG. 6 is a side view of an alternate embodiment for the curvilinear actuators having a plurality of protrusions outwardly disposed along and projecting from one electrode.
Figure 7:
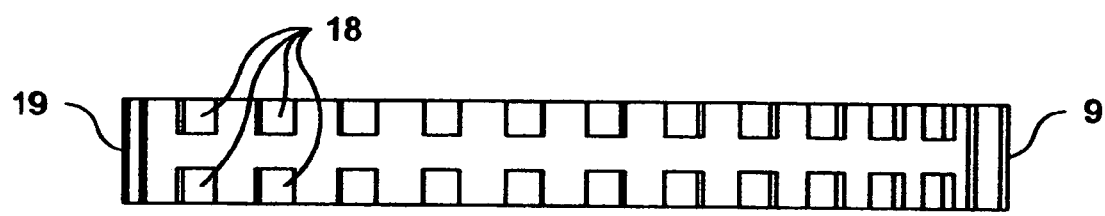
FIG. 7 is a top view of the curvilinear actuator in FIG. 6 showing a row-column arrangement of protrusions.

Referring now to FIGS. 6-7, an alternate curvilinear actuator 19 is shown including a piezoelectric layer 10 disposed between a pair of electrodes 9, 11; however, a plurality of protrusions 18 are disposed along the outer surface of one electrode 9. Protrusions 18 contact the rotatable sphere 3 so as to enhance coupling of the vibration amplitude along the electrode 9 into the rotatable sphere 3. Protrusions 18 may include a variety of shapes including, but not limited to, squares, rectangles, circles, and hexagons. Likewise, the protrusions 18 may be implemented in an ordered arrangement consisting of two or more rows and two or more columns or a random arrangement of arbitrary shaped protrusions 18. Protrusions 18 are fabricated via methods understood in the art, including machining and etching. In the present invention, a curvilinear actuator 7a-7d with protrusions 18 is capable of a unidirectional drive speed of approximately 100 mm/sec when driven at a frequency of 340 kHz.

One or more devices 6 may be attached to the rotatable sphere 3 so as to point or otherwise project from the gimbal system 1, as represented in FIGS. 2 and 3. Devices 6 may include, but are not limited to, microphones, lasers, and cameras. A variety of commercially available acoustic, light, and optical devices are adaptable to the present invention. Optical digital micro-camera technology is one example of devices applicable to the above described gimbal system 1. Microcameras are superior to conventional digital cameras in that they offer higher image quality via mega pixel resolution, true optical zoom performance, and autofocus capability. Such devices are likewise adaptable to infrared imaging.

Figure 8:
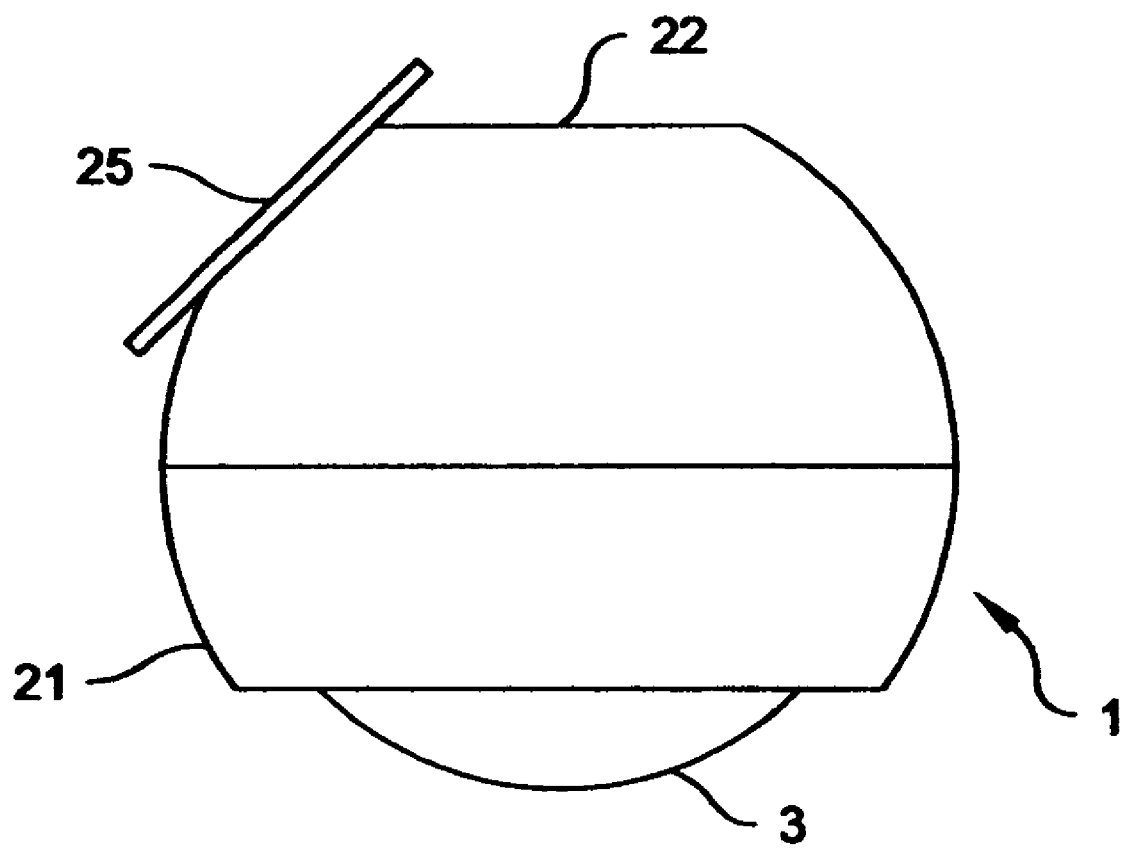
FIG. 8 shows a side elevation view of the solid state gimbal system having an optical tracker attached to the gimbal housing adjacent to the opening at the back end of the gimbal housing.

Precision aiming of the device 6 is dependent on the accurate tracking of the rotatable sphere 3 within the gimbal housing 21. The orientation of the rotatable sphere 3 with respect to the gimbal housing 21 may be determined via tracking devices and techniques for track balls. For example, the track ball optical system, model no. HDNS-2000 sold by Agilent, Inc., includes a light-emitting diode that reflects light from a textured surface, a camera that records the reflections, and a navigation engine that processes reflections to resolve the orientation of the ball or sphere. FIG. 8 shows one possible embodiment of the present invention, wherein a fully-integrated optical tracker 25 is mechanically fastened to the gimbal housing 21 immediately adjacent to the opening 22. The optical tracker 25 is arranged to project above the opening 22 as to allow the projection of a light onto the rotatable sphere 3 and recording of the projection there from.

Figure 9:
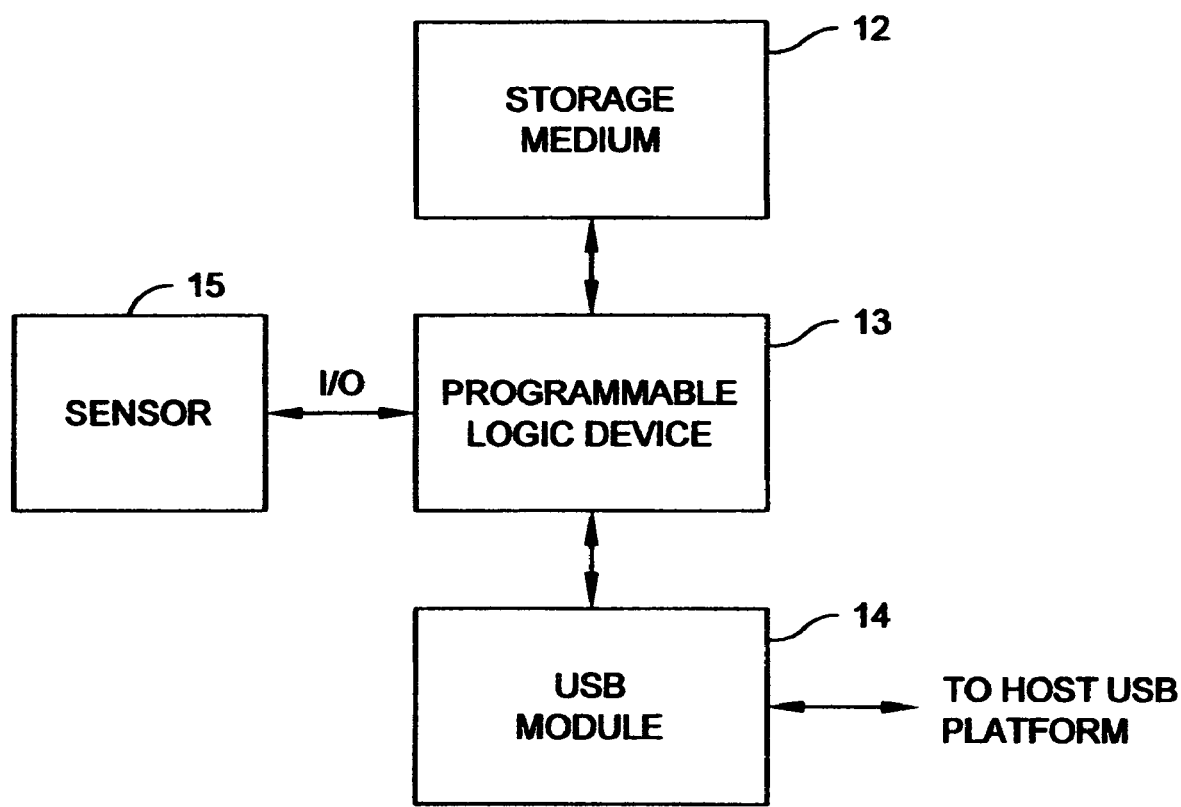
FIG. 9 is a block diagram for an exemplary embodiment showing data acquisition from a sensor attached to the gimbal system.

Referring now to FIG. 9, an exemplary block diagram is provided for acquisition and processing of data from a microcamera or other sensor 15. Data from the sensor 15 is communicated to a programmable logic device 13, one example being the CoolRunner™ Series of programmable logic ICs sold by Xilinx, Inc. The programmable logic device 13 facilitates operation of a multi-spectral digital camera within a compact chip via modifiable software to control logic gates and storage elements therein. The programmable logic device 13 communicates with a storage medium 12 to save image data. The programmable logic device 13 may also communicate image data from the sensor 15 to a USB module 14, one example being a UZBEE Stinger unit sold by QorTek, Inc., for communication to a host.

Figure 10:
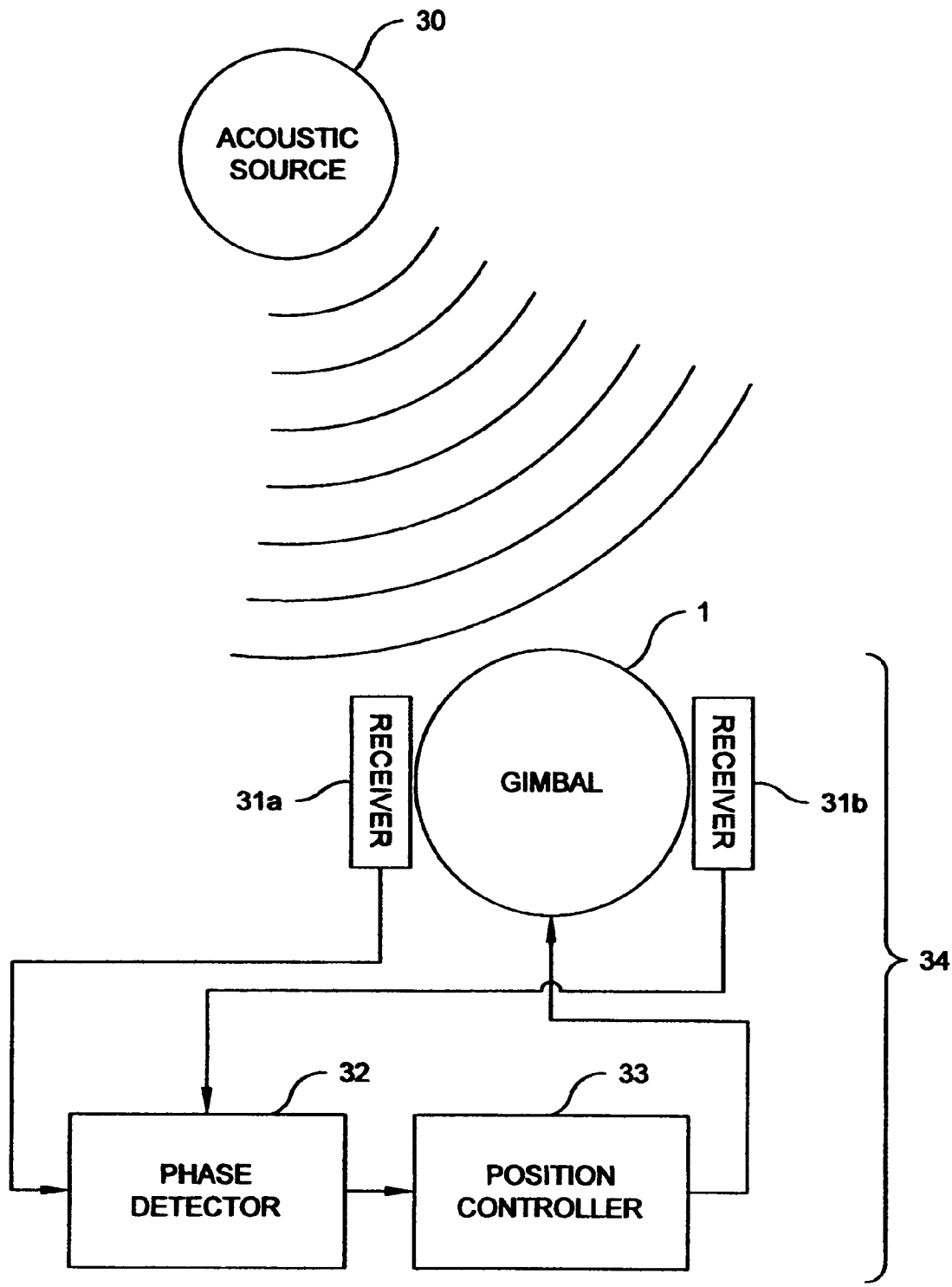
FIG. 10 is a schematic block diagram for an exemplary application of the present invention within an acoustic tracking system.

Referring now to FIG. 10, an actively controllable acoustic tracking system 34, in its simplest form, is composed of a pair of acoustic receivers 31a, 31b electrically coupled to a phase detector 32 which is coupled to a position controller 33, thereafter coupled to a gimbal system 1, the latter shown and described above. Receivers 31a, 31b are commercially available devices capable of detecting sounds generated by a moving or movable target 30, examples including but not limited to persons, animals, vehicles, objects, projectiles, and the like. TABLE 1 identifies exemplary commercial components suited to this application of the gimbal system 1. While two receivers 31a, 31b are shown, three or more such devices may be advantageous in some applications.

Receivers 31a, 31b acquire acoustic emissions which are thereafter processed by the phase detector 32, also a commercially available device. Processed emissions are then analyzed via known methods to triangulate the position of the acoustic source relative to the gimbal system 1. Positional data is communicated to the position controller 33 which then directs the gimbal system 1 to spatially locate the device 6 attached to the rotatable sphere 3, also described in FIGS. 2 and 3. Sampling and correction rates of the described system are application dependent.

TABLE 1

| Component | Exemplary Commercial Item |
| --- | --- |
| Optical | |
| IR cooled | Rockwell TCM2250 HgCdTe FPA, compact infrared camera |
| IR uncooled | BAE PMC300, miniaturized infrared camera |
| Visual color | Shenzhen DTC DV-4400CHDN, micro-camera |
| Visual B&W | C-Pro Electronics PCAM-BW/PCAM-CR, micro-camera |
| Infrared data interconnection (IrDA) | Agilent HSDL-1001 |
| Acoustic | |
| Swivel motion | Shure KSM44, microphone |
| Sound activated directional pointing | AKG C4000B, dual-diaphragm electret |

Figure 11:
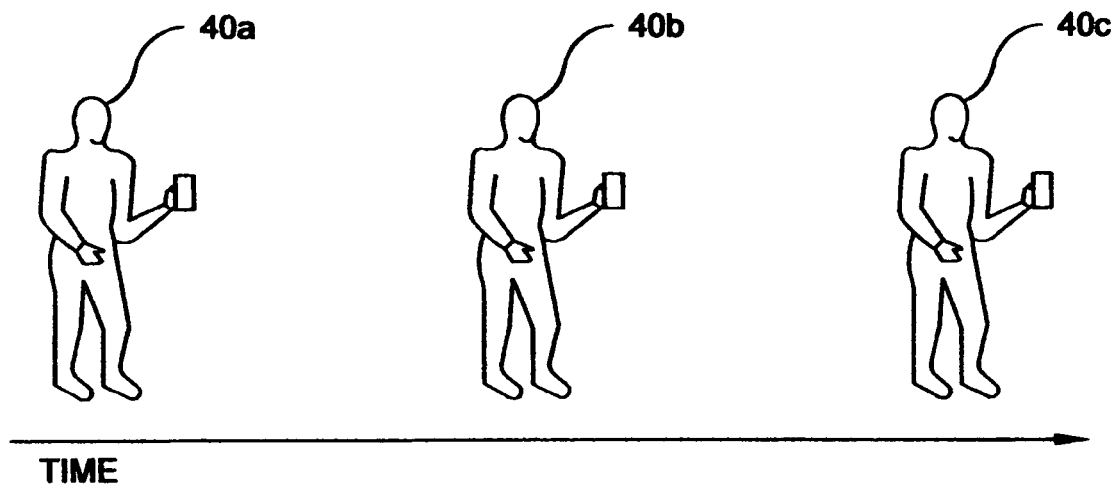
FIG. 11 is a schematic block diagram for an exemplary application of the present invention within an optical tracking system.
Figure 11:
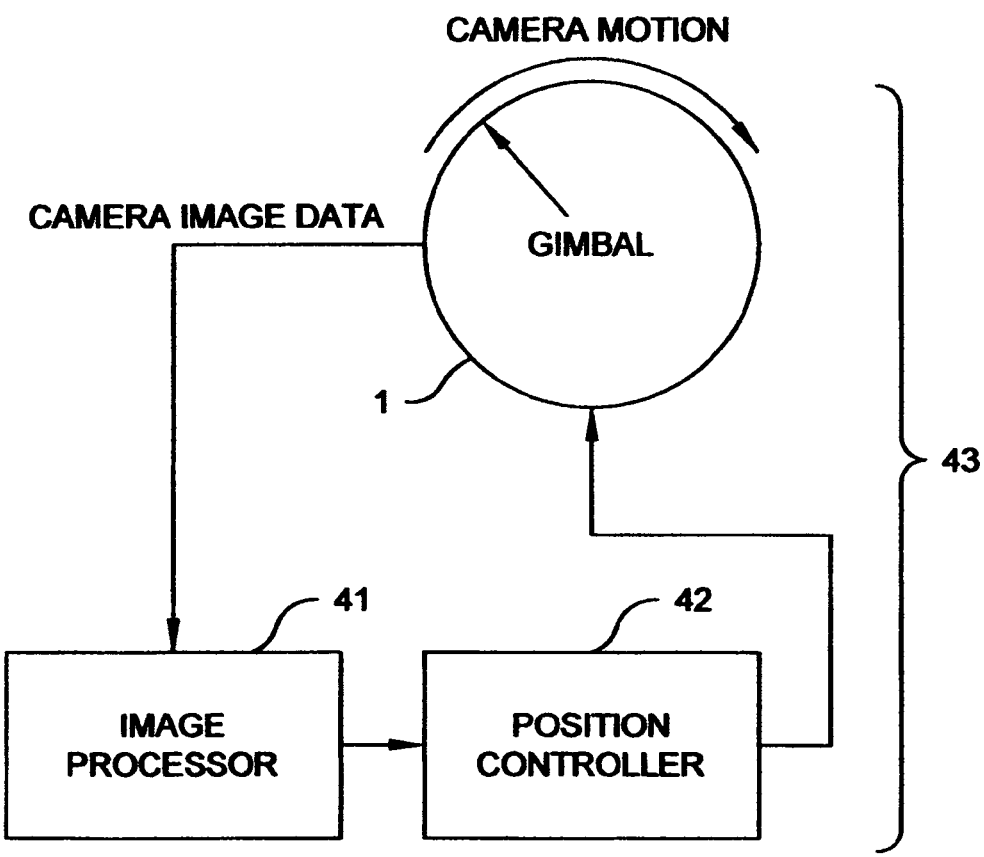

Referring now to FIG. 11, an actively controllable optical tracking system 43, in its simplest form, is composed of an optically-based device 6 coupled to a gimbal system 1, as shown and described above, which is electrically coupled to an image processor 41, and thereafter coupled to a position controller 42 which is then electrically connected to the gimbal system 1. TABLE 1 identifies several exemplary commercial components suited to this application of the gimbal system 1.

The optically-based device 6 first acquires a target 40a which is digitally mapped and recorded by the image processor 41 for tracking purposes. Subsequent images of the target 40b and 40c are likewise communicated to the image processor 41 for comparison to determine the new spatial location of the target 40a-40c relative to the optically-based device 6 housed within the gimbal system 1. Positional data is communicated to the position controller 42 which then directs the gimbal system 1 to spatially position the device 6 attached to the rotatable sphere 3 to optimize the field of view about the target 40a-40c. Sampling and correction rates of the described system are application dependent.

Figure 12:
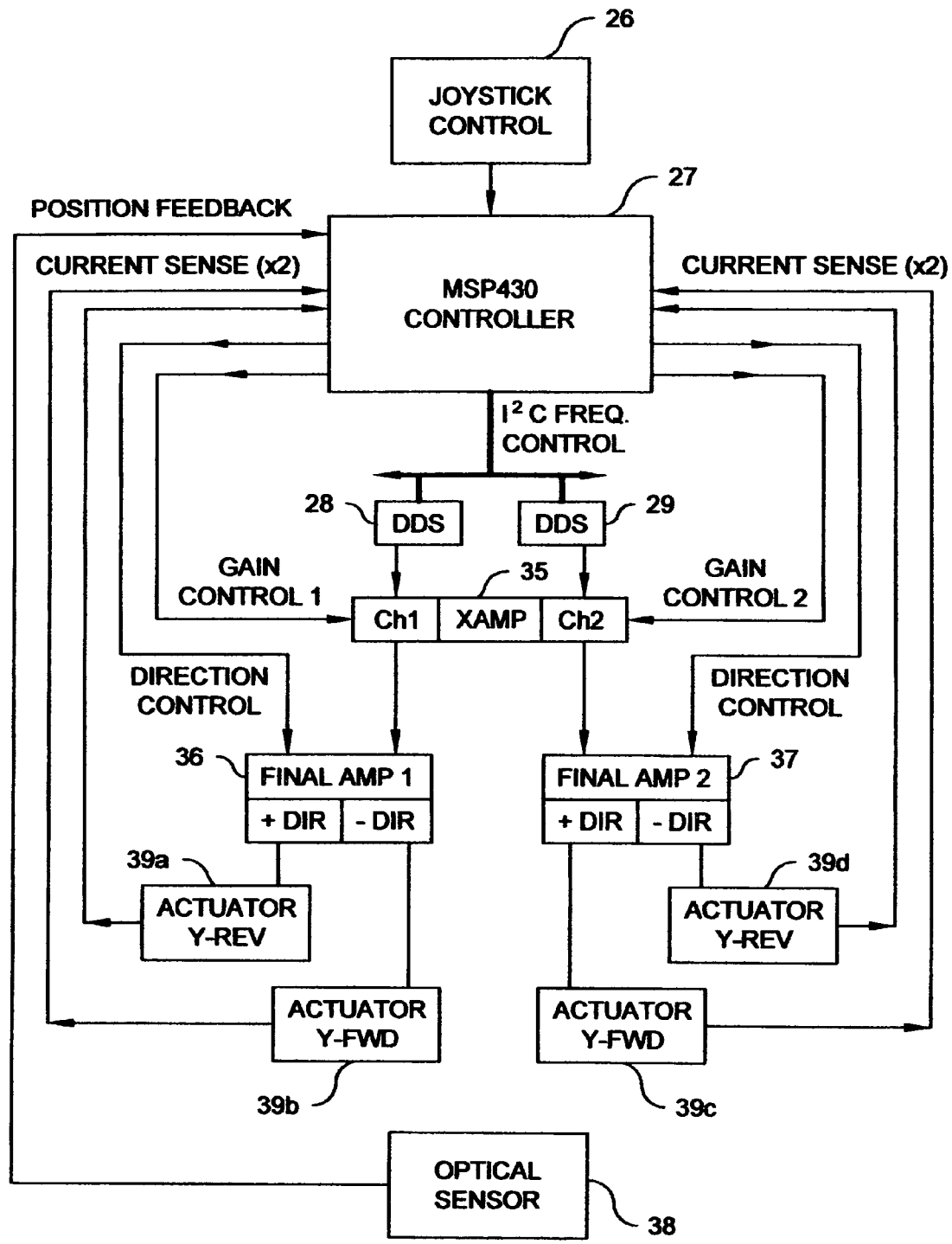
FIG. 12 is a block diagram for an exemplary application of the present invention including a joystick used to control the position of the rotatable sphere within the gimbal system.

Referring now to FIG. 12, an exemplary block diagram is shown for a joystick 26 controlled embodiment of the present invention. Elements of the device include a controller 27, a pair of direct digital synthesizers 28, 29, a variable gain amplifier 35, a pair of amplifiers 36, 37, four curvilinear actuators 39a-39d, and an optical sensor 38, electrically coupled as shown in FIG. 12. Curvilinear actuators 39a-39d are described in detail above. TABLE 2 identifies exemplary commercial components suited to this application of the gimbal system 1.

TABLE 2

| Component | Exemplary Commercial Item |
| --- | --- |
| Joystick (26) | Two axis, single joystick |
| Controller (27) | MSP430, ultra-low power 16-bit RISC mixed signal processor, 0.1 uA RAM retention, 0.8 uA real-time clock mode, 250 uA/MIPS active |
| Direct digital synthesizer (28, 29) | Analog Devices (AD9831) DDS DC-12.5 Mhz |
| Variable gain amplifier (35) | Analog Devices (AD600) 0 to 40 dB Variable Gain Amplifier |
| Amplifier (36, 37) | Linear Technologies (LT1210) 1.1A 35 Mhz Peizo Amplifier/Driver |
| Optical sensor (38) | Agilent Technologies ADNS-2051 |

The embodiment in FIG. 12 controls orientation of the rotatable sphere 3 within the gimbal system 1 by varying the drive voltage to the appropriate curvilinear actuators 39a-39d. Operation of the controller 27 is dictated primarily by input signals from the joystick 26. As such, the joystick 26 controls the orientation of the rotatable sphere 3 so as to properly align any device 6 mounted thereto. First, the controller 27 sets the initial output frequency by commanding the direct digital synthesizers 28, 29 over the I²C bus. Next, the controller 27 outputs a fixed and calculated DC gain voltage, which is directly dependant on the position of the joystick 26, to the variable gain amplifier 35. The variable gain amplifier 35 uses the DC gain voltage to either amplify or attenuate the AC signal from the direct digital synthesizers 28, 29. The output of the variable gain amplifier 35 is communicated to one or both final stage amplifiers 36, 37 which amplifies the signal voltage by a fixed value. Depending on the input direction control, the amplifiers 36, 37 electrically activate the appropriate curvilinear actuators 39a-39d. For example, curvilinear actuators 39a-39d may be arranged in a pair-wise arrangement so that curvilinear actuators 39a and 39c rotate the rotatable sphere 3 in a clockwise direction about the X-axis and Y-axis, respectively, and curvilinear actuators 39b and 39d rotate the rotatable sphere 3 in a counter-clockwise direction, respectively. Both Ch1 (X-axis) and Ch2 (Y-axis) from the variable gain amplifier 35 are identical in operation.

Proper function of the joystick 26 interface requires position information there from to be communicated to the controller 27 in a usable form. Position was determined by configuring the potentiometers within the joystick 26 as voltage dividers. An on-chip analog-to-digital converter (ADC) sampled the voltage across the potentiometers to determine absolute positions. However, movement of the potentiometer's wiper was logarithmic causing the scale to become very sensitive at the high end and very insensitive at the low end. As such, an RC charge network was employed to determine orientation of the joystick 26.

A commercially available dual 555 timer (556), in monostable, single-shot mode was configured to discharge the capacitor and to provide input to the controller 27. In this approach, the controller 27 communicates a "reset/trigger" signal to the 556 timer which discharges a capacitor with a defined capacitance. Once the capacitor voltage rises to the set threshold voltage of the 556 timer (typically, ⅔ $V_{dd}$), the output from the 556 timer toggles to a logic high. The time span from capacitor discharge output to the capacitor recharge set output is directly proportional to the orientation of the joystick 26. The exponential charge rate of the capacitor minimizes the effect of the logarithmic potentiometers within the joystick 26. This alleviated would-be overhead in processor calculations to linearize the signal. The circuit was calibrated to ensure limit and center positions were correctly sensed and interpreted via methods understood in the art.

To enable closed-loop operation, an optical sensor 38 was employed for position correction and control by tracking movement of the rotatable sphere 3 in both the X-direction and Y-direction. The optical sensor 38 first illuminates the surface of the rotatable sphere 3 with a light emitting diode (LED) and then captures a 16×16 pixel 6-bit gray-scale image. Changes in the gray-scale image are indicative of relative movement, not unlike the centroid method used for wavefront error correction in adaptive optical systems. Data from the optical sensor 38 was available in both serial (modified I²C) and quadrature formats, simultaneously. A serial interface was preferred to take advantage of sensor features and to eliminate the need for four additional timed inputs as required with the quadrature format, thus freeing processor resources.

Control circuitry for the joystick 26, controller 27, and direct digital synthesizers 28, 29, and position feedback connections were incorporated onto a single circuit board. Variable gain amplifier 35 and final amplifiers 36, 37 were incorporated onto a second circuit board to reduce noise coupling over board traces and power planes. Control circuitry was designed to compliment the drive specifications of the curvilinear actuators 39a-39d, which included 60V$_{rms}$ and 3-4 A at 300-500 kHz. The AC signal to the direct digital synthesizers 28, 29 and variable gain amplifier 35 was communicated via a miniature coax cable; whereas, a ribbon cable was used for direction control and current sensing. The amplifier board also incorporated current feedback sensors for each of four channels.

Because the current curvilinear actuators 39a-39d are "polarized", actuators were arranged in an opposed fashion so as to achieve clockwise and counter-clockwise motion about the X-axis and Y-axis. In some embodiments, it may be advantageous to include four rather than two amplifiers 36, 37 and related feedback circuits; however, control circuitry only requires two direct digital synthesizers 28, 29 and one two-channel variable gain amplifier 35. It was preferred for one amplifier to be active at any time in this alternate embodiment. Control circuitry was capable of driving the curvilinear actuators 39a-39d at 0.2-10 Vpk-pk in frequency steps of 0.1 Hz to a max frequency of 12.5 MHz. Final drive output current was limited to 1.1 A on each channel and a bandwidth of 1.2 MHz was achieved.

The description above indicates that a great degree of flexibility is offered in terms of the present invention. Although the present invention has been described in considerable detail with reference to certain preferred versions thereof, other versions are possible. Therefore, the spirit and scope of the appended claims should not be limited to the description of the preferred versions contained herein.

The invention claimed is:

1. A solid state gimbal system comprising:
   (a) a gimbal housing including a hemispherical cap and an annular cap, said hemispherical cap and said annular cap forming a spherically shaped cavity when attached, said hemispherical cap and said annular cap having at least two channels disposed along the interiors thereof;
   (b) a rotatable sphere having a radius less than said spherically shaped cavity; and
   (c) at least two shear mode curvilinear actuators, each said shear mode curvilinear actuator including a piezoelectric layer disposed between two electrodes, one said shear mode curvilinear actuator disposed within each said channel, said shear mode curvilinear actuator disposed between and compressed by said gimbal housing and said rotatable sphere, said shear mode curvilinear actuators rotating said rotatable sphere with respect to said gimbal housing when at least one said shear mode curvilinear actuator is electrically activated.

2. The solid state gimbal system of claim 1, wherein said shear mode curvilinear actuators are unidirectional and arranged in a pair-wise and opposed fashion so as to rotate said rotatable sphere either clockwise or counter-clockwise.

3. The solid state gimbal system of claim 1, further comprising:
   (d) a device attached to said rotatable sphere, said device detects or emits light or sound.

4. The solid state gimbal system of claim 3, wherein said device is a camera.

5. The solid state gimbal system of claim 3, wherein said device is a microphone.

6. The solid state gimbal system of claim 3, wherein said device is a laser.

7. The solid state gimbal system of claim 1, further comprising:
   (d) an optical tracker which determines the orientation of said rotatable sphere, said optical tracker attached to said gimbal housing adjacent to an opening within said hemispherical cap so as to visually record the movement of said rotatable sphere.

8. The solid state gimbal system of claim 1, further comprising:
   (d) a joystick; and
   (e) a control circuit electrically coupled between said joystick and said gimbal system, said control circuit positioning said rotatable sphere based on the orientation of said joystick.

9. The solid state gimbal system of claim 1, wherein said piezoelectric layer is comprised of a piezoceramic.

10. The solid state gimbal system of claim 1, wherein said shear mode curvilinear actuators have a length-to-thickness ratio of 12.

11. A solid state gimbal system comprising:
    (a) a gimbal housing including a hemispherical cap and an annular cap, said hemispherical cap and said annular cap forming a spherically shaped cavity when attached, said hemispherical cap and said annular cap having at least two channels disposed along the interiors thereof;
    (b) a rotatable sphere having a radius less than said spherically shaped cavity; and
    (c) at least two shear mode curvilinear actuators, each said shear mode curvilinear actuator including a piezoelectric layer disposed between two electrodes, one said electrode having a plurality of protrusions, said one said shear mode curvilinear actuator disposed within each said channel, said shear mode curvilinear actuator disposed between and compressed by said gimbal housing and said rotatable sphere so that said protrusions contact said rotatable sphere, said shear mode curvilinear actuators rotating said rotatable sphere with respect to said gimbal housing when at least one said shear mode curvilinear actuator is electrically activated.

12. The solid state gimbal system of claim 11, wherein said shear mode curvilinear actuators are unidirectional and arranged in a pair-wise and opposed fashion so as to rotate said rotatable sphere either clockwise or counter-clockwise.

13. The solid state gimbal system of claim 11, further comprising:
(d) a device attached to said rotatable sphere, said device sensitive to light or sound.

14. The solid state gimbal system of claim 13, wherein said device is a camera.

15. The solid state gimbal system of claim 13, wherein said device is a microphone.

16. The solid state gimbal system of claim 13, wherein said device is a laser.

17. The solid state gimbal system of claim 11, further comprising:
(d) an optical tracker to determine the orientation of said rotatable sphere, said optical tracker attached to said gimbal housing adjacent to an opening within said hemispherical cap so as to visually record the movement of said rotatable sphere.

18. The solid state gimbal system of claim 11, further comprising:
(d) a joystick; and
(e) a control circuit electrically coupled between said joystick and said gimbal system, said control circuit positioning said rotatable sphere based on the orientation of said joystick.

19. The solid state gimbal system of claim 11, wherein said piezoelectric layer is comprised of a piezoceramic.

20. The solid state gimbal system of claim 11, wherein said shear mode curvilinear actuators have a length-to-width ratio of 12.

21. The solid state gimbal system of claim 11, wherein said protrusions are disposed in an ordered arrangement along said electrode.

22. The solid state gimbal system of claim 11, wherein said protrusions are disposed in an arbitrarily arrangement along said electrode.

* * * * *